(12) United States Patent
Lim et al.

(10) Patent No.: US 9,087,734 B2
(45) Date of Patent: Jul. 21, 2015

(54) NON-VOLATILE MEMORY DEVICES WITH NON-UNIFORM FLOATING GATE COUPLING

(75) Inventors: Joon-Sung Lim, Yongin-si (KR); Jong-Ho Park, Seoul (KR); Ok-Cheon Hong, Yongin-si (KR); Ji-Hwan Jeon, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 920 days.

(21) Appl. No.: 13/158,990

(22) Filed: Jun. 13, 2011

(65) Prior Publication Data
US 2011/0303962 A1 Dec. 15, 2011

(30) Foreign Application Priority Data
Jun. 14, 2010 (KR) .................. 10-2010-0055776

(51) Int. Cl.
 *H01L 29/788* (2006.01)
 *H01L 29/66* (2006.01)
 *G11C 11/34* (2006.01)
 *H01L 27/115* (2006.01)

(52) U.S. Cl.
 CPC .... *H01L 27/11521* (2013.01); *H01L 27/11519* (2013.01)

(58) Field of Classification Search
 CPC ............ H01L 27/115; H01L 27/11521; H01L 27/11517; H01L 27/11536; H01L 27/11539; H01L 27/11541; H01L 27/11543; H01L 27/11568; H01L 29/42324; H01L 29/66825; H01L 29/42336; H01L 29/513; H01L 29/66833; H01L 29/7883; H01L 29/792; G11C 16/0483; G11C 16/0416; G11C 16/0433; G11C 16/0466
 USPC ....... 257/E27.103, E21.682, E29.129, E29.3, 257/E21.422, 314, 315, 321, E21.423, 257/E21.549, E21.68, E21.687, E21.688, 257/E29.304, E29.309, 317, 318, 319, 326; 438/257, 259, 266, 286, 287, 288, 303; 365/184, 185.17
 See application file for complete search history.

(56) References Cited

U.S. PATENT DOCUMENTS 7,863,668 B2 * 1/2011 Takahashi ..................... 257/315
2008/0055978 A1 * 3/2008 Ishibashi et al. ........... 365/185.2

(Continued)

FOREIGN PATENT DOCUMENTS

KR 1020080000907 A 1/2008
KR 1020080024373 A 3/2008

(Continued)

*Primary Examiner* — Julio J Maldonado
*Assistant Examiner* — Cory Eskridge
(74) *Attorney, Agent, or Firm* — Myers Bigel Sibley & Sajovec, P.A.

(57) ABSTRACT

A memory device includes a substrate having an active region defined therein that extends linearly along a first direction. The device also includes a select line on the substrate and extending along a second direction to perpendicularly cross the active region, first and second floating gate patterns on the active region and spaced apart along the first direction, and first and second dielectric patterns on respective ones of the first and second floating gate patterns. The device further includes first and second word lines on respective ones of the first and second dielectric patterns and extending in parallel with the select line along the first direction. A first area of overlap of the first word line with the first floating gate pattern and the first dielectric pattern is less than a second area of overlap of the second word line with the second floating gate pattern and the second dielectric pattern. The first word line may be disposed between the select line and the second word line.

15 Claims, 9 Drawing Sheets

(56) References Cited

U.S. PATENT DOCUMENTS

2011/0108901 A1* 5/2011 Matsunami et al. .......... 257/315
2012/0235222 A1* 9/2012 Kamigaichi ................. 257/324

FOREIGN PATENT DOCUMENTS

| KR | 1020080030277 A | 4/2008 |
| KR | 1020080039025 A | 5/2008 |

* cited by examiner

NON-VOLATILE MEMORY DEVICES WITH NON-UNIFORM FLOATING GATE COUPLING

CROSS-REFERENCE TO RELATED APPLICATION

This application claims priority from Korean Patent Application No. 10-2010-0055776 filed on Jun. 14, 2010 in the Korean Intellectual Property Office, and all the benefits accruing therefrom under 35 U.S.C. 119, the content of which is herein incorporated by reference in its entirety.

BACKGROUND

The inventive subject matter relates to a memory devices and methods of fabricating the same and, more particularly, to non-volatile memory devices and methods of fabricating the same.

Memory devices are used in a wide variety of apparatus, such as microcontrollers, credit cards, and the like. Memory devices can be classified into volatile memory devices, e.g., dynamic random access memory (DRAM) and static random access memory (SRAM) devices, in which data input/output can be performed quickly but data is lost as time elapses, and nonvolatile memory devices, e.g., read-only memory (ROM) devices, in which data input/output is performed relatively slowly but data can be permanently stored. Recently, there have been developed nonvolatile electrically-erasable programmable ROM (EEPROM) devices in which data input/output can be performed electrically. Such devices include flash memory devices and the like.

Such an EEPROM or flash memory device commonly has a memory cell structure in which a tunneling layer, a floating gate, an inter-gate dielectric layer structure, and a control gate electrode are sequentially formed on a semiconductor substrate. The floating gate is designed such that a coupling voltage is applied from the control gate electrode to the floating gate to establish an electric potential difference between the floating gate and the semiconductor substrate, and electrons are injected from the semiconductor substrate to the floating gate.

With the ongoing trend of device miniaturization, distances between lines forming such devices have decreased becomes small. The reduction in spacing between lines may increases coupling between the lines.

SUMMARY

Some embodiments of the inventive subject matter provide a memory device including a substrate having an active region defined therein that extends linearly along a first direction. The device also includes a select line on the substrate and extending along a second direction to perpendicularly cross the active region, first and second floating gate patterns on the active region and spaced apart along the first direction, and first and second dielectric patterns on respective ones of the first and second floating gate patterns. The device further includes first and second word lines on respective ones of the first and second dielectric patterns and extending in parallel with the select line along the second direction. A first area of overlap of the first word line with the first floating gate pattern and the first dielectric pattern is less than a second area of overlap of the second word line with the second floating gate pattern and the second dielectric pattern. The first word line may be disposed between the select line and the second word line.

The memory device may further include a first tunneling layer disposed between the active region and the first floating gate pattern and a second tunneling layer disposed between the active region and the second floating gate pattern. Each of the first and second dielectric patterns may include a lower oxide film pattern, a nitride film pattern and an upper oxide film pattern.

In some embodiments, the first and second dielectric patterns include portions disposed on top and sidewall surfaces of respective ones of the first and second floating gate patterns and the first and second word lines are disposed on the portions of the first and second dielectric patterns that are disposed on the top and sidewall surfaces of respective ones of the first and second floating gate regions. An area of overlap of the first word line and the first dielectric pattern with the sidewall surface of the first floating gate pattern may be less than an area of overlap of the second word line and the second dielectric pattern with the sidewall surface of the second floating gate pattern.

The memory device may further include respective first and second device isolation regions on and/or in the substrate and abutting at least part of the sidewall surfaces of respective ones of the first and second floating gate region. An area of contact of the sidewall surface of the first floating gate region with the first device isolation region may be greater than an area of contact of the sidewall surface of the second floating gate region with the sidewall of the second device isolation region. The first device isolation region may be thicker than the second device isolation region.

In some embodiments, the first dielectric pattern extends onto a top surface of the first device isolation region and wherein the second dielectric pattern extends onto a top surface of the second device isolation region. Top surfaces of the first and second floating gate patterns may be coplanar. In some embodiments, a portion of the first word line adjacent the sidewall surface of the first floating gate pattern extends a first distance from the top surface of the first floating gate pattern toward the substrate and a portion of the second word line adjacent the sidewall surface of the second floating gate pattern extends a second distance from the top surface of the second floating gate pattern toward the substrate. The second distance may be greater than the first distance.

In some embodiments, the select line includes a string select line (SSL) and the first word line includes a dummy word line. In some embodiments, the select line includes a ground select line (GSL) and the first word line includes a dummy word line. The select line and the first and second word lines may be included in a unit cell string.

In additional embodiments, a memory device includes a substrate and a device isolation pattern on and/or in the substrate and extending linearly along a first direction. The device also includes a select line on the substrate and extending along a second direction to perpendicularly cross the device isolation pattern and first and second word lines on the substrate and extending in parallel with the select line along the second direction to perpendicularly cross the device isolation pattern. A first portion of the device isolation pattern underlying the first word line is thicker than a second portion of the device isolation pattern underlying the second word line. The first word line may be disposed between the select line and the second word line.

Additional embodiments provide methods of fabricating memory devices. A tunneling layer is formed on a substrate and a conductive layer is formed on the tunneling layer. Portions of conductive layer, the tunneling layer and the substrate are removed to form spaced apart first and second floating gate patterns on an active region of the substrate adjacent a trench in the substrate. An insulating layer that fills the trench is formed and selectively etched to form a device isolation pattern in the trench having a first portion adjacent the first floating gate pattern and a second portion adjacent the second floating gate pattern, wherein the first portion of the device isolation pattern is thicker than the second portion of the device isolation pattern. A first dielectric pattern is formed overlying the first floating gate pattern and the first portion of the device isolation pattern and a second dielectric pattern is formed overlying the second floating gate pattern and the second portion of the device isolation pattern. A first word line is formed overlying the first dielectric pattern, the first floating gate pattern and the first portion of the device isolation pattern and a second word line is formed overlying the second dielectric pattern, the second floating gate pattern and the second portion of the device isolation pattern.

Selectively etching the insulating layer to form a device isolation pattern may include etching the insulating layer to a first depth to form the first portion of the device isolation pattern, masking the first portion of the device isolation pattern and further etching the insulating layer to form the second portion of the device isolation pattern.

A first area of overlap of the first word line with the first floating gate pattern and the first dielectric pattern may be less than a second area of overlap of the second word line with the second floating gate pattern and the second dielectric pattern.

BRIEF DESCRIPTION OF THE DRAWINGS

The above and other aspects and features of the inventive subject matter will become more apparent by describing in detail exemplary embodiments thereof with reference to the attached drawings, in which.

DETAILED DESCRIPTION

Advantages and features of the inventive subject matter same may be understood more readily by reference to the following detailed description of exemplary embodiments and the accompanying drawings. The inventive subject matter may, however, be embodied in many different forms and should not be construed as being limited to the embodiments set forth herein. Rather, these embodiments are provided so that this disclosure will be thorough and complete and will fully convey the concept of the invention to those skilled in the art, and the inventive subject matter will only be defined by the appended claims. In the drawings, sizes and relative sizes of layers and regions may be exaggerated for clarity.

Throughout the specification, like reference numerals in the drawings denote like elements. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless specially defined, all terms (including technical and scientific terms) used in the description could be used as meanings commonly understood by those ordinary skilled in the art to which the inventive subject matter belongs. In addition, terms that are generally used but are not defined in the dictionary are not interpreted ideally or excessively unless they have been clearly and specially defined.

A non-volatile memory device in accordance with some embodiments of the inventive subject matter will be described with reference to FIGS. 1 to 3.

Figure 1:
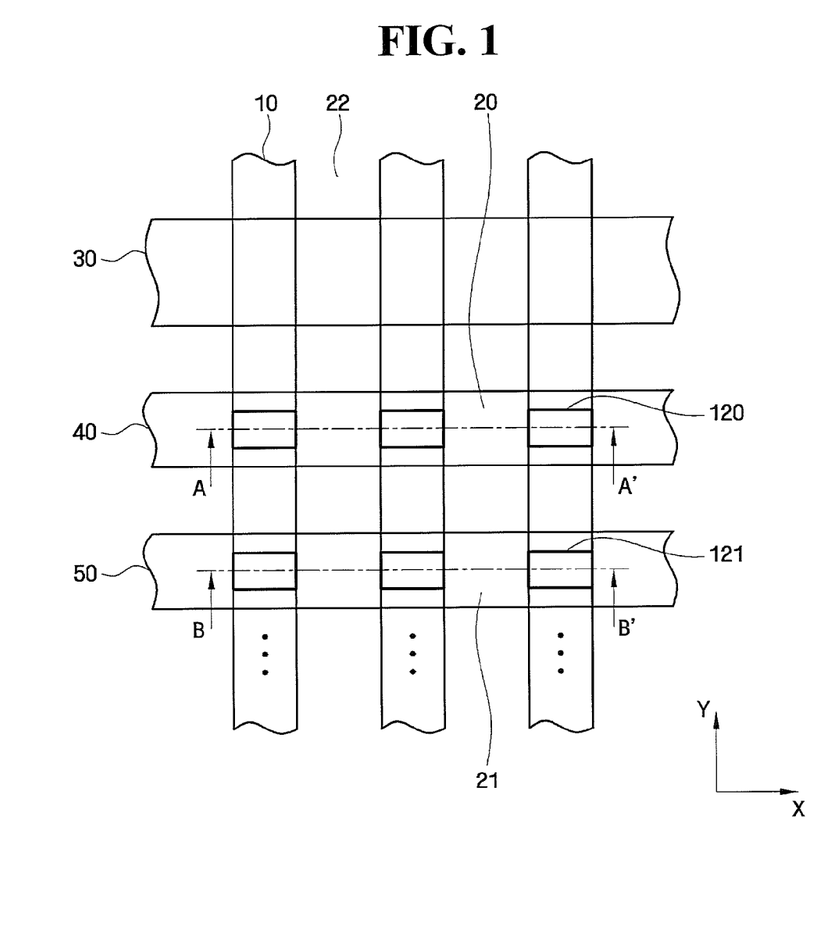
FIG. 1 illustrates a layout of a unit cell string of a non-volatile memory device in accordance with some embodiments of the inventive subject matter.

FIG. 1 illustrates a layout of a unit cell string of a non-volatile memory device in accordance with some embodiments of the inventive subject matter. FIG. 2 and FIG. 3 illustrate cross sectional views taken along lines A-A' and B-B' of FIG. 1, respectively. Hereinafter, flash memory devices will be described as examples, but the inventive subject matter is not limited thereto.

Figure 2:
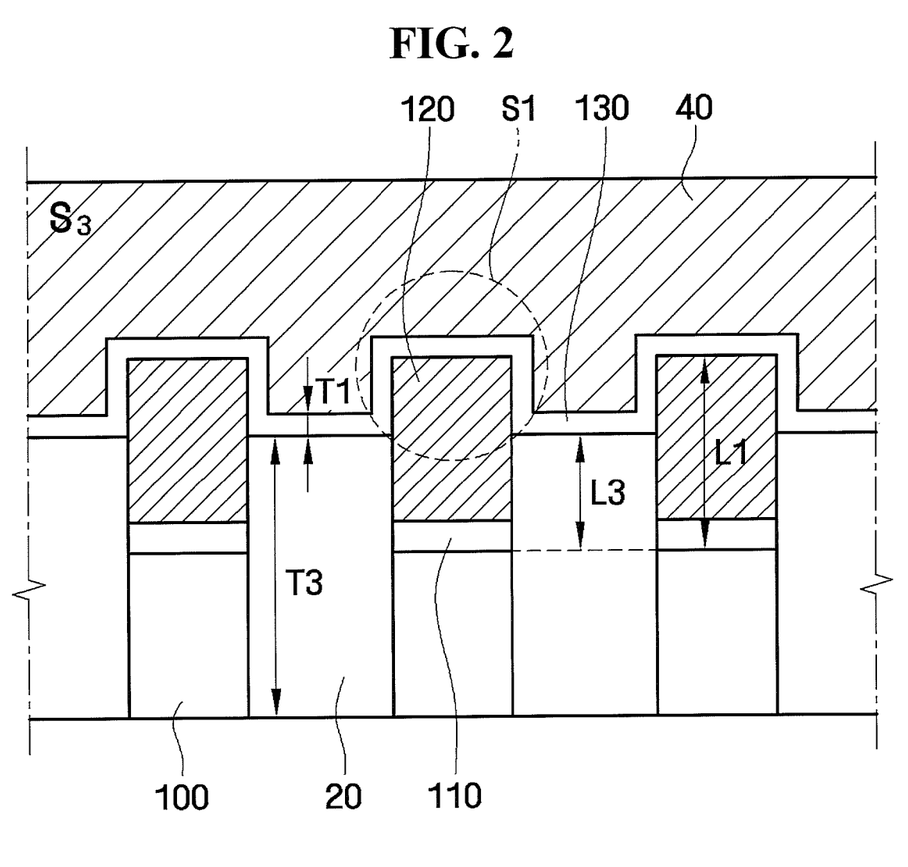
FIG. 2 and FIG. 3 illustrate cross sectional views taken along lines A-A' and B-B' of FIG. 1, respectively.
Figure 3:
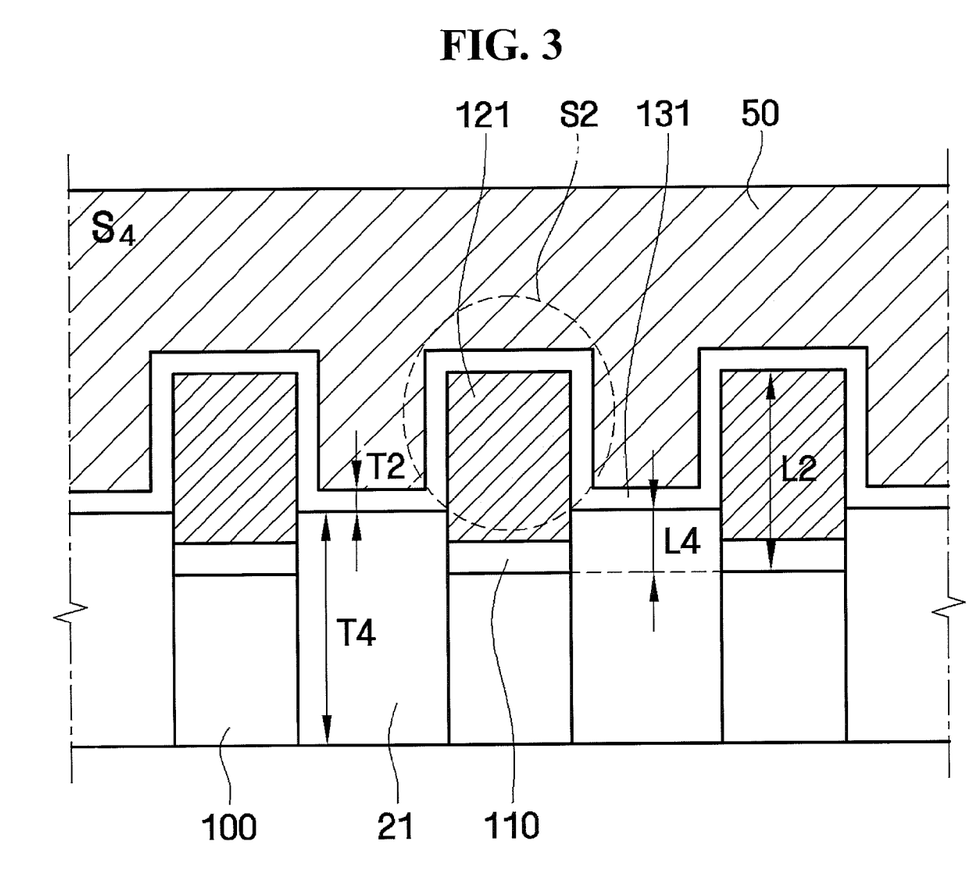

Referring to FIGS. 1 to 3, a non-volatile memory device in accordance with some embodiments of the inventive subject matter may include a substrate 100, a tunneling layer 110, first and second floating gate patterns 120 and 121, first and second device isolation patterns 20 and 21, first and second dielectric patterns 130 and 131, a select line 30, and first and second word lines 40 and 50.

The substrate 100 may be, for example, a silicon substrate, a silicon-on-insulator (SOI) substrate, a silicon germanium substrate or the like. However, this is merely exemplary, and another material may be used as the substrate 100. Referring to FIG. 1, a plurality of active regions 10 and a plurality of device isolation regions 22 may be defined on the substrate 100. The active regions 10 and the device isolation regions 22 may be formed to extend in parallel in a first direction, e.g., a Y direction as shown in FIG. 1.

Source and drain regions may be formed in the active regions 10 of the substrate 100. The source and drain regions may be doped with p-type or n-type impurities. A channel region may be formed between a pair of source and drain regions. The source and drain regions may have, for example, a double diffused drain (DDD) or lightly doped drain (LDD) structure.

First and second device isolation patterns 20 and 21 may be formed in the device isolation regions 22 of the substrate 100. Specifically, the first device isolation pattern 20 may be formed where the device isolation region 22 intersects the first word line 40, and the second device isolation pattern 21 may be formed where the device isolation region 22 intersects the second word line 50.

The tunneling layer 110, the first and second floating gate patterns 120 and 121, the first and second dielectric patterns 130 and 131, the select line 30 and the first and second word lines 40 and 50 may be formed on the substrate 100.

The tunneling layer 110 may be interposed between the substrate 100 and the first and second floating gate patterns 120 and 121 to provide an energy barrier to tunneling of electrons. The tunneling layer 110 can provide a movement path of electric charges during programming and erasing operations. For example, the tunneling layer 110 may be a silicon oxide layer or a silicon oxynitride layer, and may be formed through a thermal oxidation process. The thickness of the tunneling layer 110 may be, for example, about 60 Å or more.

The first and second floating gate patterns 120 and 121 can retain electrons injected from the substrate 100 through the tunneling layer 110. The first and second floating gate patterns 120 and 121 may store information. The first and second floating gate patterns 120 and 121 may be formed, for example, of conductive polysilicon, and more specifically, may be a polysilicon film doped with n-type or p-type impurities. However, this is merely exemplary, and the inventive subject matter is not limited thereto.

Referring to FIG. 1, the first and second floating gate patterns 120 and 121 may be formed in a second direction transverse to the first direction, e.g., in an X direction as shown in FIG. 1. The first and second floating gate patterns 120 and 121 may be formed in the same direction as the first and second dielectric patterns 130 and 131 and the first and second word lines 40 and 50.

The first and second dielectric patterns 130 and 131 may be formed on the first and second floating gate patterns 120 and 121 and the first and second device isolation patterns 20 and 21. The first dielectric pattern 130 may be formed on the first floating gate pattern 120 and the first device isolation pattern 20, and the second dielectric pattern 131 may be formed on the second floating gate pattern 121 and the second device isolation pattern 21. The first and second dielectric patterns 130 and 131 may be formed to extend in the second direction (e.g., the X direction) described above.

The first and second dielectric patterns 130 and 131 may be interposed between the first and second floating gate patterns 120 and 121 and the first and second word lines 40 and 50 to electrically insulate the first and second floating gate patterns 120 and 121 from the first and second word lines 40 and 50. The first and second dielectric patterns 130 and 131 may prevent the electrons stored in the first and second floating gate patterns 120 and 121 from being emitted to the first and second word lines 40 and 50 or being injected into the first and second floating gate patterns 120 and 121. The first and second dielectric patterns 130 and 131 may have a structure of a lower oxide film pattern, a nitride film pattern and an upper oxide film pattern, i.e., an oxide-nitride-oxide (ONO) structure.

The first and second word lines 40 and 50 may be formed on the first and second dielectric patterns 130 and 131, respectively. Specifically, the first word line 40 may be formed on the first dielectric pattern 130, and the second word line 50 may be formed on the second dielectric pattern 131. The first and second word lines 40 and 50 may be formed to extend in the second direction (e.g., the X direction) described above. The first and second word lines 40 and 50 may serve as a control gate in a unit memory cell. The select line 30 may be formed to extend in the second direction (e.g., the X direction) as shown in FIG. 1 in parallel with the first and second word lines 40 and 50.

The select line 30 of the non-volatile memory device in accordance with some embodiments of the inventive subject matter may be, for example, a string select line (SSL). In this case, the first word line 40 may be a dummy word line and the second word line 50 may be a (n−1)$^{th}$ word line WL(n−1), where n represents the number of word lines included in a unit cell string of the non-volatile memory device. In some embodiments, the select line 30 may be, for example, a ground select line (GSL). In this case, the first word line 40 may be a dummy word line and the second word line 50 may be a 0$^{th}$ word line WL0.

In a read operation, a voltage Vread is applied to the select line 30. The first word line 40 may be soft-programmed by coupling due to the voltage Vread applied to the select line 30. The soft-programmed first word line 40 may also be capacitively coupled to the second word line 50. Accordingly, in the read operation, this coupling may cause misreading of data stored in the second word line 50, thereby reducing reliability of the device. Therefore, it is desirable to reduce a coupling between the select line 30 and the first word line 40.

Hereinafter, the reduction of a coupling between the select line 30 and the first word line 40 of the non-volatile memory device in accordance with some embodiments of the inventive subject matter will be described in detail.

In general, a ratio of a voltage being applied to the tunneling layer 110 to a voltage being applied to the control gate (the first and second word lines 40 and 50 in the above-described embodiments) in a floating gate type non-volatile memory device may be represented as a coupling ratio γ in the following Eq. 1:

$$\gamma = \frac{C_{IPD}}{C_{Tu-ox} + C_{IPD}}, \tag{1}$$

where $C_{IPD}$ denotes capacitance of the first and second dielectric patterns 130 and 131, and $C_{Tu-ox}$ denotes capacitance of the tunneling layer 110. It can be seen from the Eq. 1 that reducing the capacitance of the first and second dielectric patterns 130 and 131 may reduce the coupling ratio γ.

Referring to FIGS. 2 and 3, in a non-volatile memory device in accordance with some embodiments of the inventive subject matter, a contact area S1 between the first floating gate pattern 120 and the first dielectric pattern 130 formed below the first word line 40 is less than a contact area S2 between the second floating gate pattern 121 and the second dielectric pattern 131 formed below the second word line 50. Accordingly, since the coupling ratio of the first word line 40 (e.g., dummy word line) is less than the coupling ratio of the second word line 50 (e.g., (n−1)$^{th}$ word line WL(n−1) or 0$^{th}$ word line WL0), the coupling between the select line 30 and the first word line 40 can be reduced.

Referring to FIGS. 2 and 3, it can be seen that the contact area S1 between the first floating gate pattern 120 and the first dielectric pattern 130 formed below the first word line 40 is less than the contact area S2 between the second floating gate pattern 121 and the second dielectric pattern 131 formed below the second word line 50 because a thickness T3 of the first device isolation pattern 20 is greater than a thickness T4 of the second device isolation pattern 21. Specifically, as shown in FIGS. 2 and 3, a distance L1 from an upper surface of the substrate 100 to an upper surface of the first floating gate pattern 120 may be equal to a distance L2 from the upper surface of the substrate 100 to an upper surface of the second floating gate pattern 121, and a thickness T1 of the first dielectric pattern 130 may be equal to a thickness T2 of the second dielectric pattern 131. Accordingly, the contact areas S1 and S2 between the first and second dielectric patterns 130 and 131 and the first and second floating gate patterns 120 and 121 depends on the thicknesses of the first and second device isolation patterns 20 and 21. In a non-volatile memory device in accordance with some embodiments of the inventive subject matter, since the thickness T3 of the first device isolation pattern 20 is greater than the thickness T4 of the second device isolation pattern 21, the contact area S1 between the first floating gate pattern 120 and the first dielectric pattern 130 is less than the contact area S2 between the second floating gate pattern 121 and the second dielectric pattern 131.

Referring again to FIGS. 2 and 3 in view of the first and second dielectric patterns 130 and 131, it can be seen that a minimum distance L3 from the upper surface of the substrate 100 to a lower surface of the first dielectric pattern 130 is greater than a minimum distance L4 from the upper surface of the substrate 100 to a lower surface of the second dielectric pattern 131. Further, it can be seen that a cross sectional area S3 of the first word line 40 taken along the second direction (e.g., X direction) is less than a cross sectional area S4 of the second word line 50 along the second direction (e.g., X direction).

Although only the select line 30 and the first and second word lines 40 and 50 are illustrated in FIG. 1, third and fourth word lines (not shown) and the like may be further formed below the second word line 50. The third and fourth word lines (not shown) and the like may have the same structure as the second word line 50.

Hereinafter, operations for fabricating a non-volatile memory device in accordance with some embodiments of the inventive subject matter will be described with reference to FIGS. 4 to 7.

Figure 4:
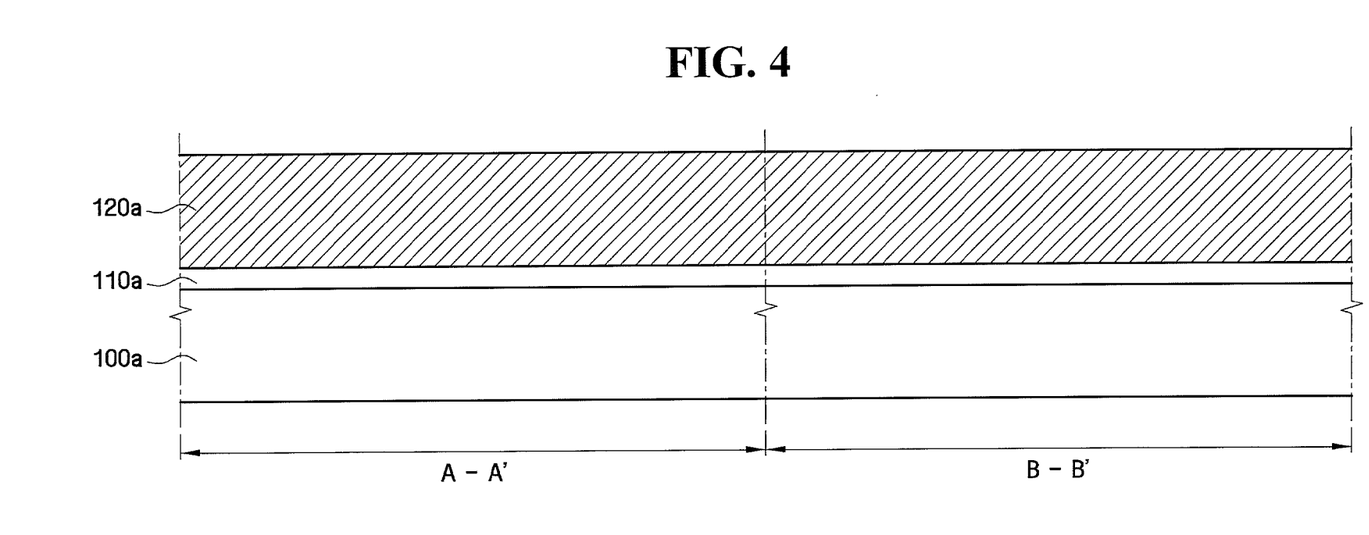
FIGS. 4 to 7 are diagrams illustrating operations for fabricating a non-volatile memory device in accordance with some embodiments of the inventive subject matter.

Referring to FIG. 4, a tunneling layer 110a is formed on a substrate 100a. A floating gate layer 120a is formed on the tunneling layer 110a.

Figure 5:
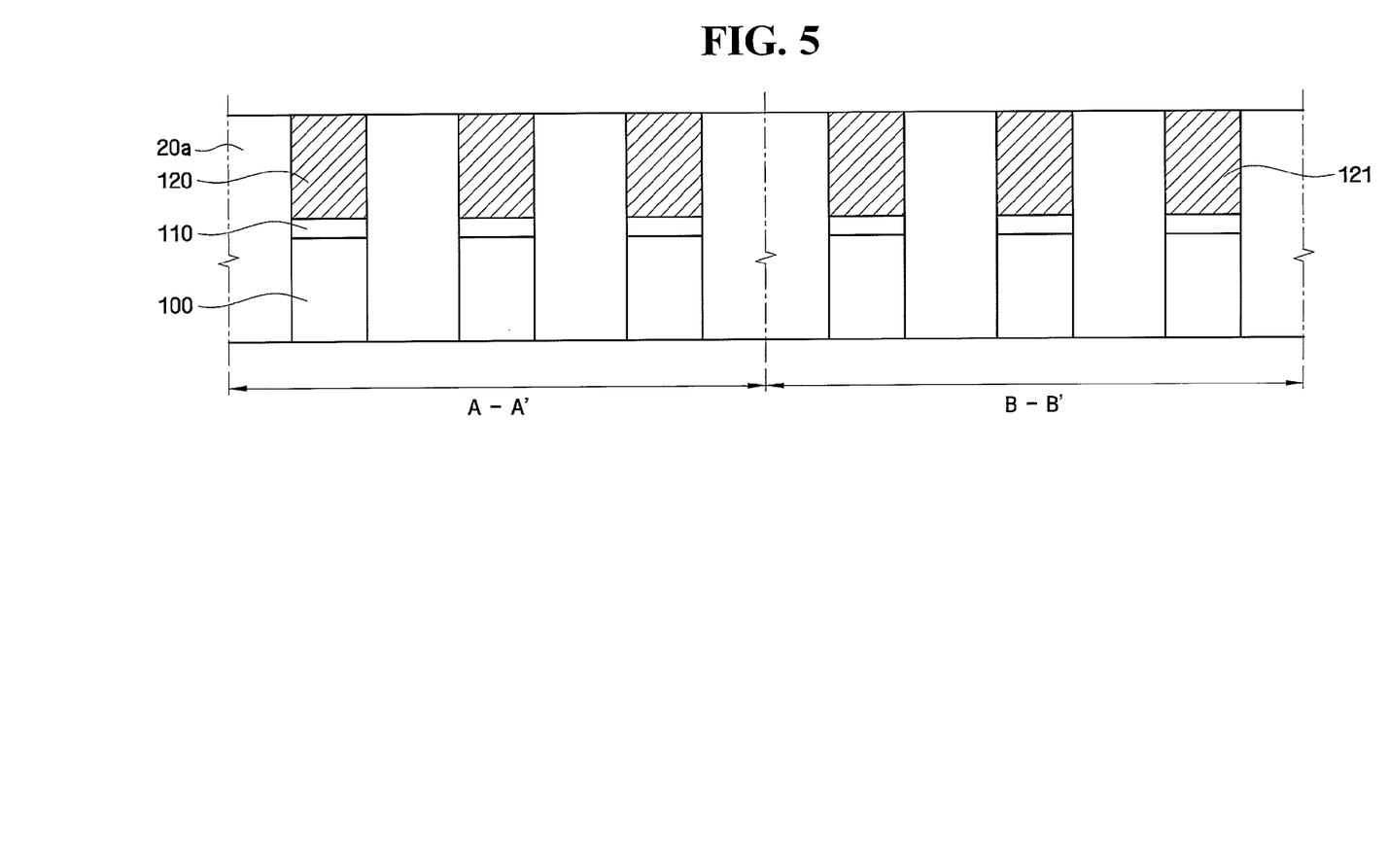

Referring to FIGS. 4 and 5, the first and second floating gate patterns 120 and 121 and the device isolation regions 22 are formed by etching the substrate 100a, the tunneling layer 110a and the floating gate layer 120a, and a device isolation layer 20a is formed in the device isolation regions 22. The device isolation layer 20a may be formed, for example, by depositing an oxide film in the device isolation regions 22 and planarizing the deposited oxide film.

Figure 6:
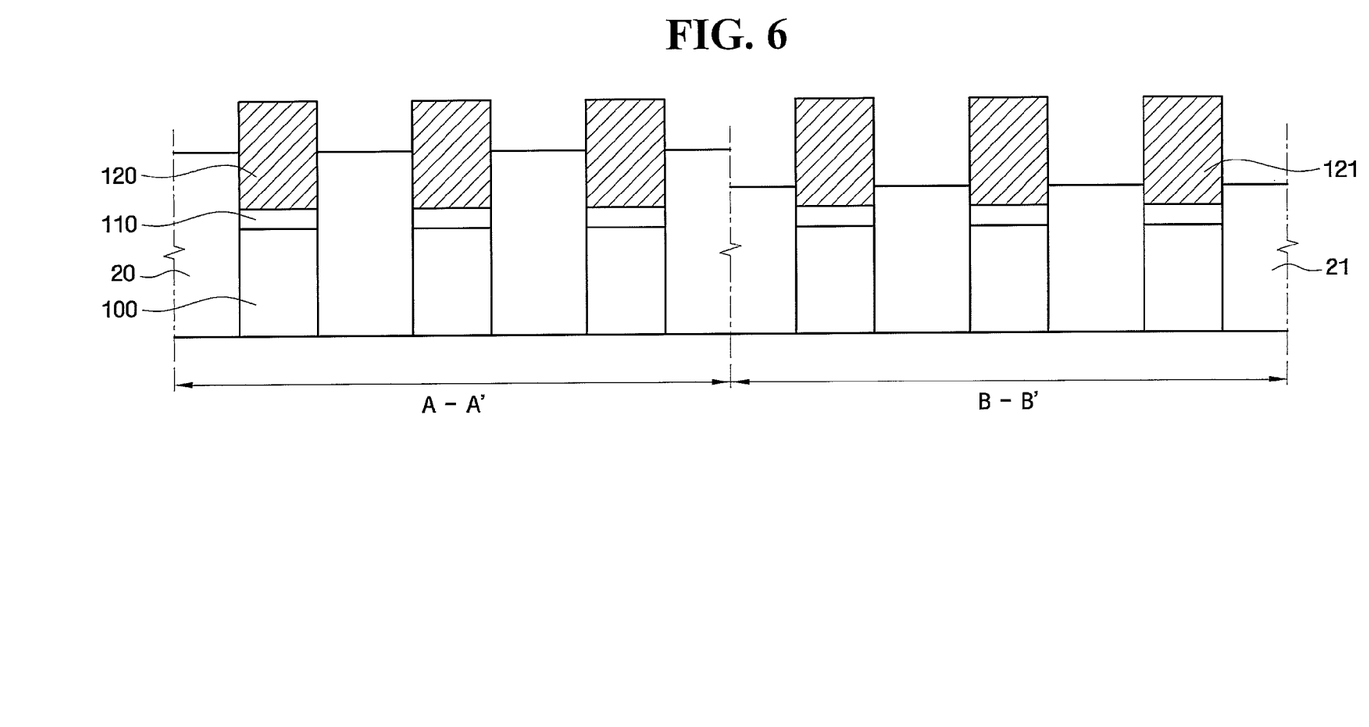

Referring to FIGS. 5 and 6, the first and second device isolation patterns 20 and 21 are formed by etching the device isolation layer 20a.

Specifically, the first device isolation pattern 20 is formed by a first etching process for etching a region of the device isolation layer 20a on which the first word line 40 (see FIG. 1) will be formed and a region of the device isolation layer 20a on which the second word line 50 (see FIG. 1) will be formed.

The second device isolation pattern 21 is formed by a second etching process for etching only the region of the device isolation layer 20a on which the second word line 50 (see FIG. 1) will be formed while using a mask on the first device isolation pattern 20. The thickness of the first device isolation pattern 20 formed as described above is greater than the thickness of the second device isolation pattern 21.

Figure 7:
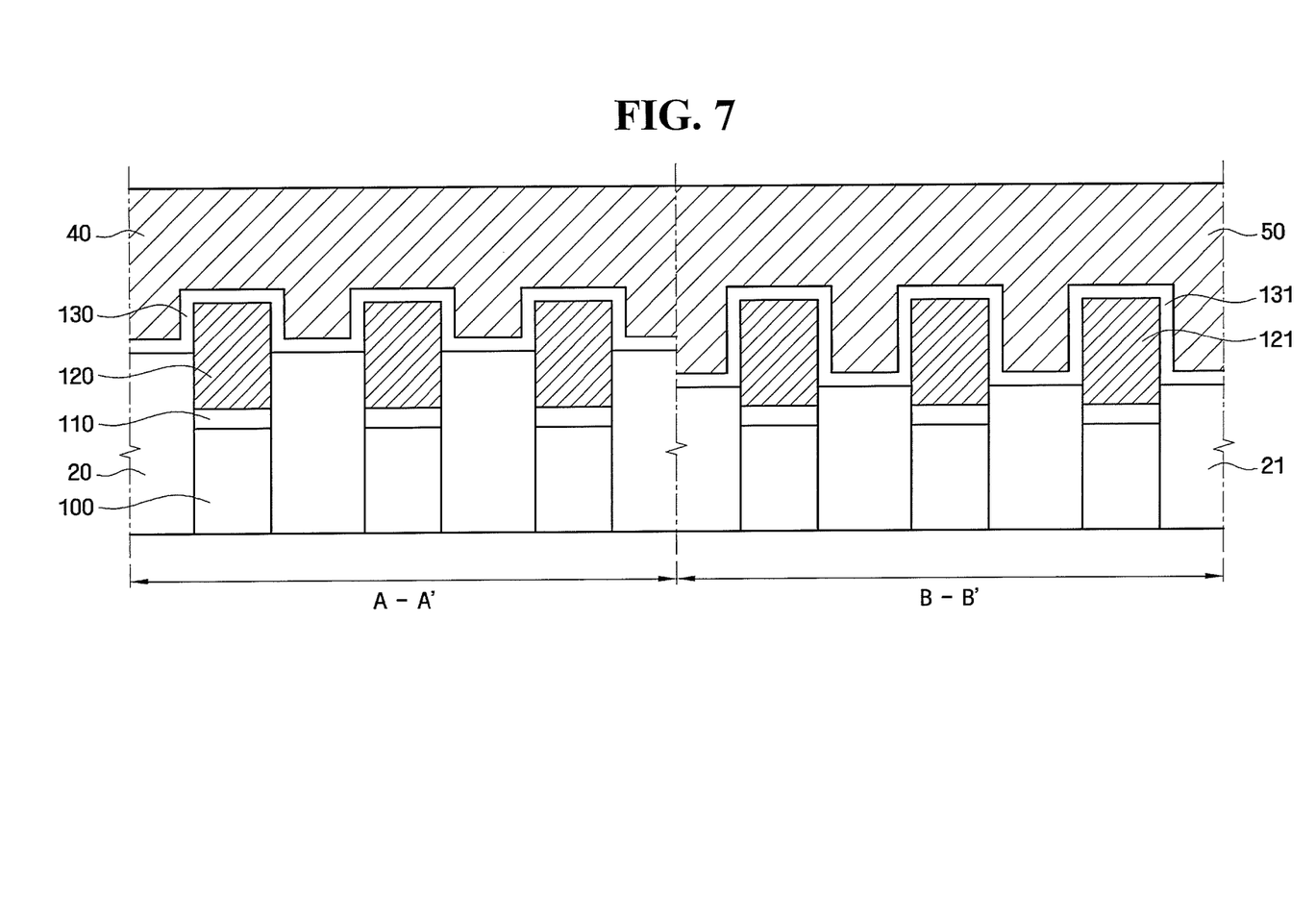

Referring to FIGS. 6 and 7, the first and second dielectric patterns 130 and 131 are formed on respective ones of the first and second floating gate patterns 120 and 121 and on respective ones of the first and second device isolation patterns 20 and 21. The first and second dielectric patterns 130 and 131 are formed such that they conform to the first and second floating gate patterns 120 and 121 and the first and second device isolation patterns 20 and 21 with a substantially uniform thickness.

The first and second word lines 40 and 50 are formed on the first and second dielectric patterns 130 and 131, respectively.

Figure 8:
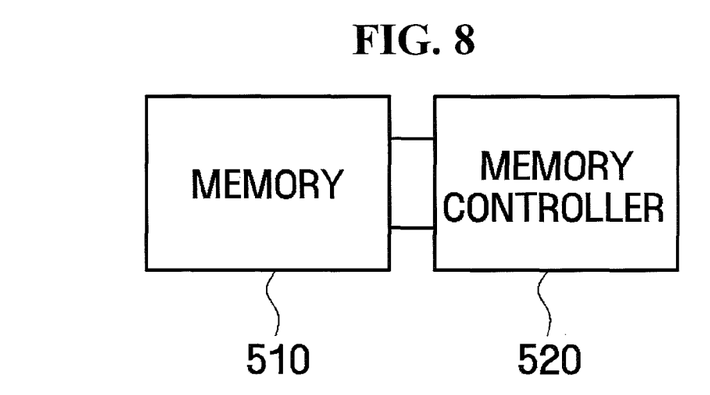
FIGS. 8 to 10 are diagrams illustrating applications of a non-volatile memory device in accordance with some embodiments of the inventive subject matter.

Examples of applications of non-volatile memory devices in accordance with embodiments of the inventive subject matter will be described with reference to FIGS. 8 to 10. Referring to FIG. 8, a system in accordance with some embodiments of the inventive subject matter includes a memory 510 and a memory controller 520 connected to the memory 510. The memory 510 may be a non-volatile memory device as described above, e.g., a device structured to reduce the coupling between lines. The memory controller 520 may provide an input signal for controlling an operation of the memory 510, e.g., an address signal and a command signal for controlling a read operation and a write operation, to the memory 510.

The system including the memory 510 and the memory controller 520 may be embodied in a circuit card, such as a memory card. Specifically, a system in accordance with some embodiments of the inventive subject matter may be embodied in a card which satisfies a specified industry standard and is used in an electronic device such as a mobile phone, a two-way communication system, a one-way pager, a two-way pager, a personal communication system, a portable computer, a personal data assistance (PDA), an audio and/or video player, a digital and/or video camera, a navigation system, a global positioning system (GPS), and the like. However, the inventive subject matter is not limited thereto, and a system in accordance with some embodiments of the inventive subject matter may be embodied in various forms, such as a memory stick.

Figure 9:
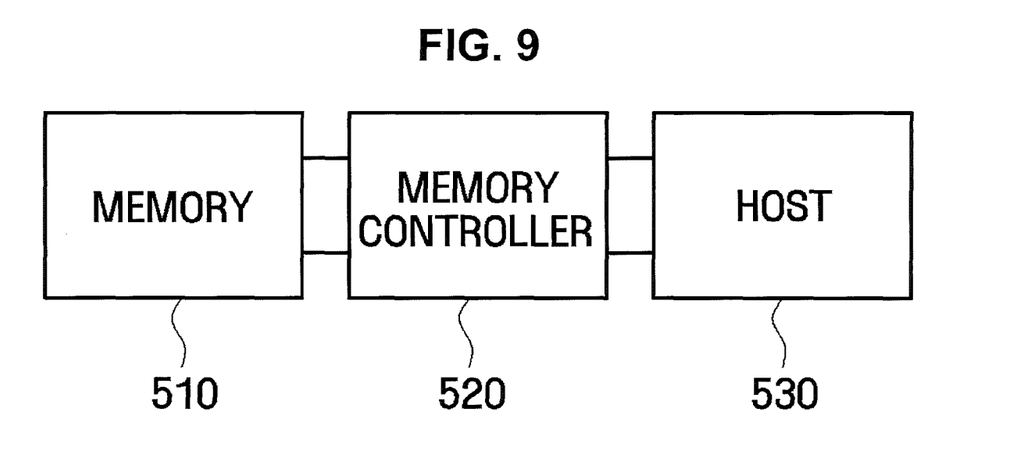

Referring to FIG. 9, a system in accordance with some embodiments of the inventive subject matter may include a memory 510, a memory controller 520, and a host system 530. In this case, the host system 530 may be connected to the memory controller 520 via a bus and the like, and provide a control signal to the memory controller 520, so that the memory controller 520 can control an operation of the memory 510.

The host system 530 may be, for example, a processing system used in a mobile phone, a two-way radio communication system, a one-way pager, a two-way pager, a personal communication system, a portable computer, a PDA, an audio and/or video player, a digital and/or video camera, a navigation system, a GPS, and the like.

Although the memory controller 520 is interposed between the memory 510 and the host system 530 in FIG. 9, it is not limited thereto, and the memory controller 520 may be omitted in a system in accordance with some embodiments of the inventive subject matter.

Figure 10:
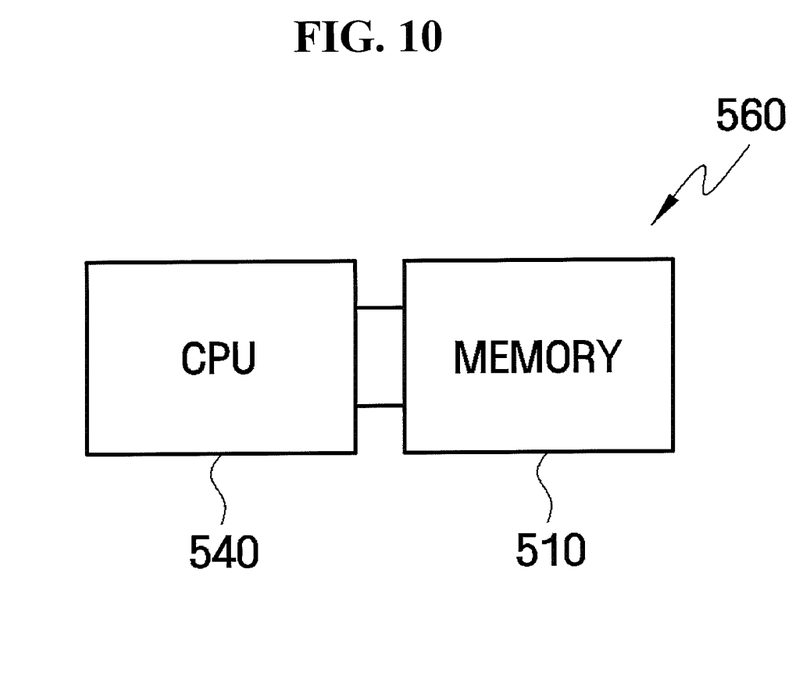

Referring to FIG. 10, a system in accordance with some embodiments of the inventive subject matter may be a computer system 560 including a central processing unit (CPU) 540 and a memory 510. In the computer system 560, the memory 510 is connected to the CPU 540 directly or using a typical computer bus architecture. The memory 510 may store an operation system (OS) instruction set, a basic input/output start up (BIOS) instruction set, an advanced configuration and power interface (ACPI) instruction set and the like, or may be used as a large-capacity storage device such as a solid state disk (SSD).

For convenience of explanation, all constituent elements that may be included in the computer system 560 are not illustrated in FIG. 10. For convenience of explanation, the memory controller 520 is omitted between the memory 510 and the CPU 540 in FIG. 10. However, the memory controller 520 may be interposed between the memory 510 and the CPU 540 in still some embodiments of the inventive subject matter.

While the inventive subject matter has been particularly shown and described with reference to exemplary embodiments thereof, it will be understood by those of ordinary skill in the art that various changes in form and detail may be made therein without departing from the spirit and scope of the inventive subject matter as defined by the following claims. The exemplary embodiments should be considered in a descriptive sense only and not for purposes of limitation.

What is claimed is:

1. A memory device comprising:
a substrate having plurality of spaced apart active regions defined therein that extend linearly in parallel along a first direction;
a select line on the substrate and extending along a second direction to perpendicularly cross the active region;
first and second floating gate patterns on one of the active regions and spaced apart along the first direction;
first and second dielectric patterns on respective ones of the first and second floating gate patterns and extending along the second direction; and
first and second word lines on respective ones of the first and second dielectric patterns and extending in parallel with the select line along the second direction, wherein a first area of contact of the first floating gate pattern with the first dielectric pattern is less than a second area of contact of the second floating gate pattern with the second dielectric pattern.

2. The memory device of claim 1, wherein the first word line is disposed between the select line and the second word line.

3. The memory device of claim 2, wherein the first and second dielectric patterns comprise portions disposed on top and sidewall surfaces of respective ones of the first and second floating gate patterns and wherein the first and second word lines are disposed on the portions of the first and second dielectric patterns that are disposed on the top and sidewall surfaces of respective ones of the first and second floating gate regions.

4. The memory device of claim 3, wherein an area of overlap of the first word line and the first dielectric pattern with the sidewall surface of the first floating gate pattern is less than an area of overlap of the second word line and the second dielectric pattern with the sidewall surface of the second floating gate pattern.

5. The memory device of claim 4, further comprising respective first and second device isolation regions on and/or in the substrate and abutting at least part of the sidewall surfaces of respective ones of the first and second floating gate regions and wherein an area of contact of the sidewall surface of the first floating gate region with the first device isolation region is greater than an area of contact of the sidewall surface of the second floating gate region with the sidewall of the second device isolation region.

6. The memory device of claim 5, wherein the first device isolation region is thicker than the second device isolation region.

7. The memory device of claim 5, wherein the first dielectric pattern extends onto a top surface of the first device isolation region and wherein the second dielectric pattern extends onto a top surface of the second device isolation region.

8. The memory device of claim 3, wherein the top surfaces of the first and second floating gate patterns are coplanar.

9. The memory device of claim 3, wherein a portion of the first word line adjacent the sidewall surface of the first floating gate pattern extends a first distance from the top surface of the first floating gate pattern toward the substrate and wherein a portion of the second word line adjacent the sidewall surface of the second floating gate pattern extends a second distance from the top surface of the second floating gate pattern toward the substrate, and wherein the second distance is greater than the first distance.

10. The memory device of claim 1, wherein the select line comprises a string select line (SSL), and wherein the first word line comprise a dummy word line.

11. The memory device of claim 1, wherein the select line comprises a ground select line (GSL), and wherein the first word line comprises a dummy word line.

12. The memory device of claim 1, wherein the select line and the first and second word lines are included in a unit cell string.

13. The memory device of claim 1, wherein the first dielectric pattern and the second dielectric pattern have the same thickness.

14. The memory device of claim 1, further comprising a first tunneling layer disposed between the active region and the first floating gate pattern and a second tunneling layer disposed between the active region and the second floating gate pattern, wherein a first coupling ratio that is a ratio of a voltage being applied to the tunneling layer to a voltage being applied to the first word line is less than a second coupling ratio that is a ratio of a voltage being applied to the tunneling layer to a voltage being applied to the second word line.

15. The memory device of claim 1, wherein each of the first and second dielectric patterns includes a lower oxide film pattern, a nitride film pattern and an upper oxide film pattern.

* * * * *